United States Patent
Shimizu et al.

(10) Patent No.: US 9,299,574 B2
(45) Date of Patent: Mar. 29, 2016

(54) SILICON DIOXIDE-POLYSILICON MULTI-LAYERED STACK ETCHING WITH PLASMA ETCH CHAMBER EMPLOYING NON-CORROSIVE ETCHANTS

(71) Applicant: Applied Materials, Inc., Santa Clara, CA (US)

(72) Inventors: Daisuke Shimizu, Saratoga, CA (US); Jong Mun Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/157,997

(22) Filed: Jan. 17, 2014

(65) Prior Publication Data

US 2014/0213062 A1    Jul. 31, 2014

Related U.S. Application Data

(60) Provisional application No. 61/757,027, filed on Jan. 25, 2013.

(51) Int. Cl.
   *H01L 21/3065* (2006.01)
   *B81C 1/00* (2006.01)
   (Continued)

(52) U.S. Cl.
   CPC ........ *H01L 21/3065* (2013.01); *B81C 1/00531* (2013.01); *H01J 37/32146* (2013.01);
   (Continued)

(58) Field of Classification Search
   CPC ............... H01L 21/31116; H01L 21/3065; H01L 21/32137; H01L 21/67069; H01L 21/0332; H01L 21/3081; H01L 21/31138; H01L 21/32139; H01J 37/32165; H01J 37/32082; H01J 2237/334; B81C 1/00531
   See application file for complete search history.

(56) References Cited

U.S. PATENT DOCUMENTS 7,381,651 B2  6/2008  Sakthivel et al.
8,133,819 B2  3/2012  Wang et al.
(Continued)

FOREIGN PATENT DOCUMENTS

KR   10-0322695   5/2002
KR   10-0468700   3/2005
KR   10-1170861   8/2012

OTHER PUBLICATIONS

H. Xiao, Introduction to Semiconductor Manufacturing Technology, published by Prentice Hall, 2001, ISBN 0-13-022404-9, pp. 354-356.*

(Continued)

*Primary Examiner* — Jiong-Ping Lu
(74) *Attorney, Agent, or Firm* — Blakely Sokoloff Taylor Zafman LLP

(57) ABSTRACT

Multilayered stacks having layers of silicon interleaved with layers of a dielectric, such as silicon dioxide, are plasma etched with non-corrosive process gas chemistries. Etching plasmas of fluorine source gases, such as $SF_6$ and/or $NF_3$ typically only suitable for dielectric layers, are energized by pulsed RF to achieve high aspect ratio etching of silicon/silicon dioxide bi-layers stacks without the addition of corrosive gases, such as HBr or $Cl_2$. In embodiments, a mask open etch and the multi-layered stack etch are performed in a same plasma processing chamber enabling a single chamber, single recipe solution for patterning such multi-layered stacks. In embodiments, 3D NAND memory cells are fabricated with memory plug and/or word line separation etches employing a fluorine-based, pulsed-RF plasma etch.

12 Claims, 10 Drawing Sheets

(51) Int. Cl.
- H01L 21/67 (2006.01)
- H01L 21/033 (2006.01)
- H01L 21/308 (2006.01)
- H01L 21/311 (2006.01)
- H01L 21/3213 (2006.01)
- H01J 37/32 (2006.01)
- H01L 27/115 (2006.01)

(52) U.S. Cl.
CPC ....... *H01J37/32165* (2013.01); *H01L 21/0332* (2013.01); *H01L 21/3081* (2013.01); *H01L 21/31116* (2013.01); *H01L 21/31122* (2013.01); *H01L 21/31138* (2013.01); *H01L 21/32137* (2013.01); *H01L 21/32139* (2013.01); *H01L 21/67069* (2013.01); *H01L 27/11556* (2013.01); *H01L 27/11582* (2013.01)

(56) References Cited

U.S. PATENT DOCUMENTS

| | | | |
|---|---|---|---|
| 8,778,207 | B2 | 7/2014 | Kim et al. |
| 2002/0090827 | A1 | 7/2002 | Yokoshima |
| 2003/0075524 | A1 | 4/2003 | Kawaguchi et al. |
| 2004/0084412 | A1 | 5/2004 | Waldfried et al. |
| 2004/0144491 | A1 | 7/2004 | Ohuchi et al. |
| 2006/0231524 | A1 | 10/2006 | Liu et al. |
| 2007/0080136 | A1 | 4/2007 | Takata et al. |
| 2007/0245959 | A1 | 10/2007 | Paterson et al. |
| 2008/0067583 | A1 | 3/2008 | Kidoh et al. |
| 2009/0212010 | A1 | 8/2009 | Wang et al. |
| 2011/0031216 | A1* | 2/2011 | Liao et al. ........................ 216/67 |
| 2011/0306214 | A1 | 12/2011 | Zin |
| 2012/0080779 | A1 | 4/2012 | Seamons et al. |
| 2013/0059450 | A1* | 3/2013 | Le Gouil et al. .............. 438/715 |
| 2013/0109188 | A1 | 5/2013 | Kim et al. |
| 2013/0279066 | A1 | 10/2013 | Lubomirsky et al. |

OTHER PUBLICATIONS

S. Wolf and R.N. Tauber, Silicon Processing for the VLSI Era, vol. 1, Lattice Press, ISBN 0-9616721-6-1, year 2000, pp. 673-675.*
International Search Report and Written Opinion for Application No. PCT/US2013/066953 dated Feb. 25, 2014, 11 pages.
International Search Report and Written Opinion from PCT/US14/12592 mailed May 20, 2014, 10 pages.
Office Action mailed Nov. 19, 2014, in U.S. Appl. No. 14/168,350, 13 pages.
Restriction Requirement mailed Sep. 8, 2014, in U.S. Appl. No. 14/168,350, 6 pages.
Howard, Brad, "Applied Centura Avatar Etch Enabling New Dimensions in High Aspect Ratio Etching", *Silicon Systems Group*, Jun. 27, 2012, 20 pages.
U.S. Appl. No. 13/651,047, filed Oct. 12, 2012, 29 pages.
International Preliminary Report on Patentability from PCT/US2014/012592 mailed Aug. 6, 2015, 7 pgs.

* cited by examiner

| RF | Pressure | Temperature | SF$_6$ | CH$_4$ | O$_2$ | N$_2$ |
|---|---|---|---|---|---|---|
| 162 MHz 1kW-3kW pulsed 5-8kHz | 20-50mT | 10-50 C | 1 | 1.2-1.65 (SF$_6$) | 0.04-0.15 (SF$_6$) | 0.7-1.5 (SF$_6$) |
| 60 MHz 0.5kW-3kW pulsed 5-8kHz | | | | | | |
| 2 MHz 4kW-8kW pulsed 5-8kHz | | | | | | |

FIG. 7A

| RF | Pressure | Temperature | SF$_6$ | CH$_4$ | O$_2$ | N$_2$ | NF$_3$ |
|---|---|---|---|---|---|---|---|
| 162 MHz 1kW-3kW pulsed 5-8kHz | 20-50mT | 10-50 C | 1 | 2-30 (SF$_6$) | 0.4-4 (SF$_6$) | 1-30 (SF$_6$) | 1-20 (SF$_6$) |
| 60 MHz 0.5kW-3kW pulsed 5-8kHz | | | | | | | |
| 2 MHz 4kW-8kW pulsed 5-8kHz | | | | | | | |

FIG. 7B

SILICON DIOXIDE-POLYSILICON MULTI-LAYERED STACK ETCHING WITH PLASMA ETCH CHAMBER EMPLOYING NON-CORROSIVE ETCHANTS

PRIORITY

This application is a Non-Provisional of, claims priority to, and incorporates by reference in its entirety for all purposes, the U.S. Provisional Patent Application No. 61/757,027 filed Jan. 25, 2013.

TECHNICAL FIELD

Embodiments of the present invention pertain to the field of semiconductor processing and, in particular, to methods of plasma etching multi-layered films comprising both silicon and dielectric layers.

DESCRIPTION OF RELATED ART

Memory chips comprise a large fraction of the semiconductor devices manufactured. One popular semiconductor memory technology is NAND EEPROM (flash), a schematic of which is illustrated in FIG. 1A. Generally, a 16-bit unit of NAND includes a string of 18 transistors. With limitations in lithography becoming more problematic with each dimensional shrink, current trends in semiconductor device scaling include three dimensional (3D) device design. FIG. 1B illustrates one exemplary 3D NAND architecture whereby the transistor string is vertically oriented rather than laterally oriented. As shown in FIG. 1B, transistors in the string 150 are each coupled to a gate electrode layer forming upper and lower select gates and 16 control gates there between.

While the 3D NAND holds much promise for further scalability (e.g. potentially enabling terabit cell arrays), even in lieu of further lithographic advancement, manufacture of such a device is challenging particularly with respect to forming the vertical features (e.g., plugs) extending through the many gate electrode layers. As shown in FIG. 1B, 18 gate electrode layers, each separated by an interlayer dielectric may need to be etched in certain advantageous integration schemes. As such, more than 16 pairs of films (i.e., bi-layers) are etched and with each film having a finite thickness, e.g., 20-60 nanometers (nm), the total etch depth to clear the stack of bi-layers may be very thick, with the thickness increasing to over two microns where the vertical transistor count is increased for even higher bit count.

Compositional differences of the materials in the bi-layers, make etching a 3D NAND bi-layer stack even more challenging. Whereas typical etch processes clear one film with high selectively to an underlayer, within the 3D NAND bi-layer stack, the gate electrode layers are advantageously polysilicon while the interlayer dielectric (ILD) is silicon dioxide. However, most plasma etch systems are designed to etch either one, but not both of these materials. Indeed, systems which etch silicon dioxide well typically do so with very high selectivity to polysilicon while the converse is true for conductor etch systems, making it inherently difficult to etch both films with a single plasma etch system.

SUMMARY

Silicon dioxide-polysilicon multi-layered stack etching with a plasma etch chamber employing non-corrosive etchants is described herein.

In one embodiment, a method of etching a stack of silicon and dielectric layers disposed over a substrate involves loading the substrate into a plasma etch chamber. The substrate has a mask layer disposed over the stack of silicon and dielectric layers. The method involves introducing process gases into the chamber. The process gases are all non-corrosive. The method involves energizing the process gases into a plasma with RF energy of at least one frequency. The RF energy is pulsed over time between an RF on state and an RF off state. The method further involves etching with the plasma portions of the stack not covered by the mask layer. The etching has a selectivity to the mask layer of at least 1:1. The method also involves unloading the substrate from the plasma etch chamber.

In one embodiment, a method of forming a three dimensional (3D) NAND memory device involves loading a substrate into a plasma etch chamber. The substrate has a mask layer disposed over a stack of silicon word line gate electrode layers electrically isolated from each other by an intervening silicon-based dielectric layer. The method involves introducing process gases into the chamber. The process gases are all non-corrosive. The method involves energizing the process gases into a plasma with RF energy of at least one frequency. The RF energy is pulsed over time between an RF on state and an RF off state. The method involves etching, with the plasma, vias or trenches through the thickness of the stack in regions not covered by the mask layer, the etching having a selectivity to the mask layer greater than 1:1. The method also involves unloading the substrate from the plasma etch chamber.

According to one embodiment, a plasma etch apparatus includes a process chamber and a chuck disposed in the process chamber to support a substrate while being etched. The apparatus includes a plurality of source gases plumbed to the chamber. The plurality of source gases includes $SF_6$, $NF_3$, $CH_4$, $O_2$, $N_2$, and COS. The apparatus includes a plurality of RF generators to energize the process gases into a plasma with a plurality of RF frequencies. The apparatus also includes a pulse controller coupled to the plurality of RF generators. The pulse controller pulses each of the RF generators over time between an RF on state and an RF off state synchronously to have all generators in the RF off state concurrently for at least some period of time.

BRIEF DESCRIPTION OF THE DRAWINGS

Embodiments of the present invention are illustrated by way of example, and not limitation, in the figures of the accompanying drawings in which:

FIGS. 7A and 7B are tables depicting plasma etch conditions in accordance with embodiments of the present invention.

DETAILED DESCRIPTION

Multilayered stacks having layers of silicon interleaved with layers of a dielectric, such as silicon dioxide, are plasma etched with non-corrosive process gas chemistries. In the following description, numerous specific details are set forth, such as plasma chamber hardware, gas chemistries, and process sequences, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

In embodiments, non-corrosive gases are employed to etch both silicon and dielectric layers of a stack comprising both these material layers. While corrosive gases, such as HBr or $Cl_2$, are well-known to readily etch silicon, embodiments herein advantageously avoid the use of such gases, enabling much simpler etching hardware that is of both lower fixed cost and with lower consumables costs. In embodiments, the non-corrosive gases are fluorine-based, which are known to readily etch many dielectrics (e.g., silicon-based dielectrics such as silicon dioxide, silicon nitride, silicon oxynitride, etc.), but also well-known to be poor etchants of silicon under conventional plasma etch conditions. It has been found by the inventors however, that with appropriate control of the RF sources energizing a plasma including fluorine species and substantially free of corrosive gases (e.g., with no deliberate addition of $Cl_2$, HBr, or the like), one can etch silicon at appreciably high rates and without suffering from etch stop at even very high aspect ratios (AR) (e.g., aspect ratios of 20 or more). The etch rate is sufficiently high that even where the thickness of a silicon layer (e.g., polysilicon) is greater than the thickness of an intervening dielectric layer (e.g., silicon dioxide), acceptable selectivity to an overlying mask layer is sufficient to etch through even a 2 micron (μm) stack of silicon/dielectric bi-layers.

In embodiments, the etching plasmas include a fluorine-containing source gas, such as $SF_6$ and/or $NF_3$, energized by pulsed RF to achieve high aspect ratio etching of a stack of polysilicon/dielectric bi-layers without the addition of corrosive gases. In embodiments, a mask open etch and the multi-layered stack etch are performed in a same plasma processing chamber enabling a single chamber, single recipe solution for patterning such multi-layered stacks. In embodiments, 3D NAND memory cells are fabricated with memory plug and/or word line separation etches employing a fluorine-based, pulsed-RF plasma etch.

Figure 1A:
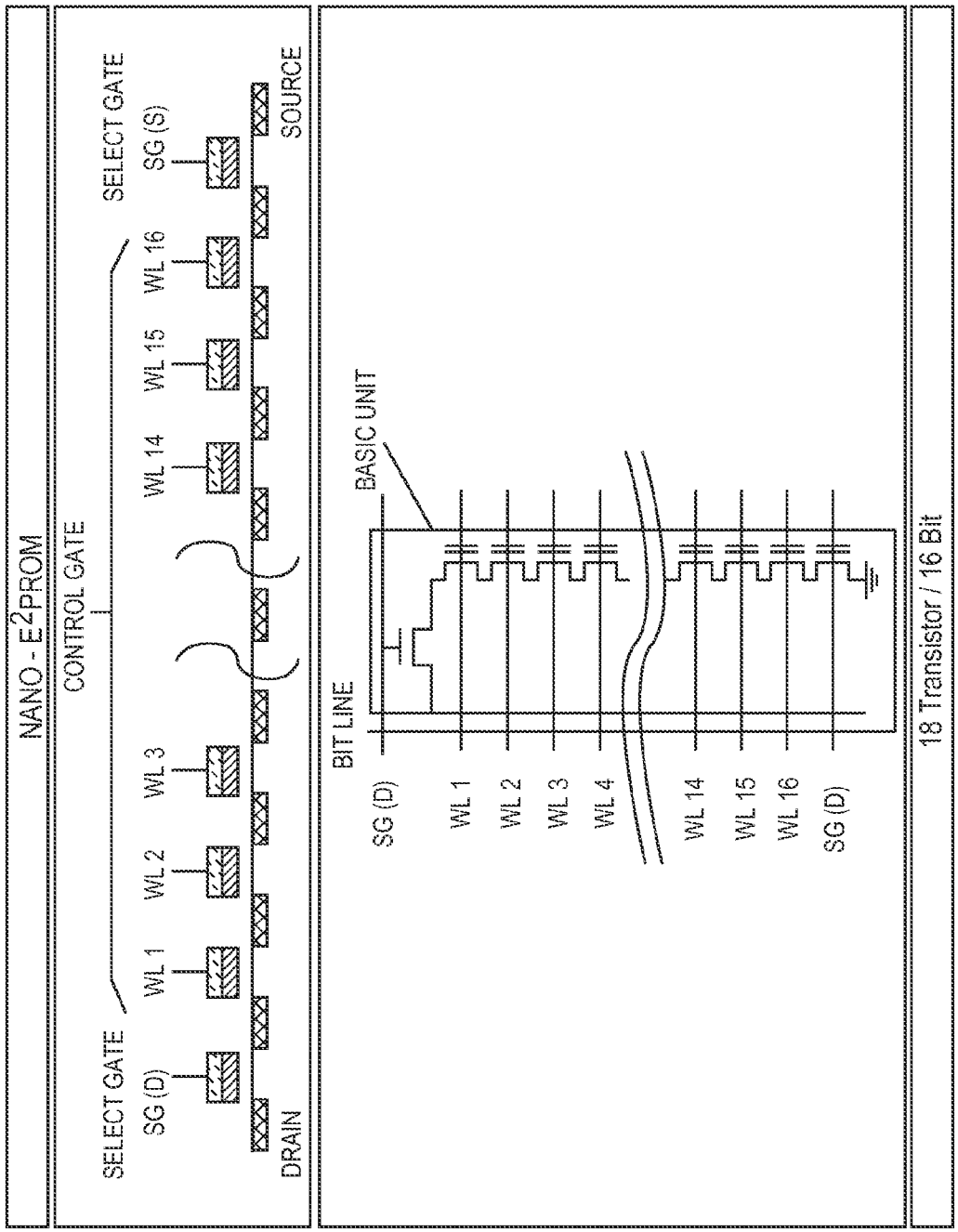
FIG. 1A is a schematic of a conventional NAND architecture.
Figure 1B:
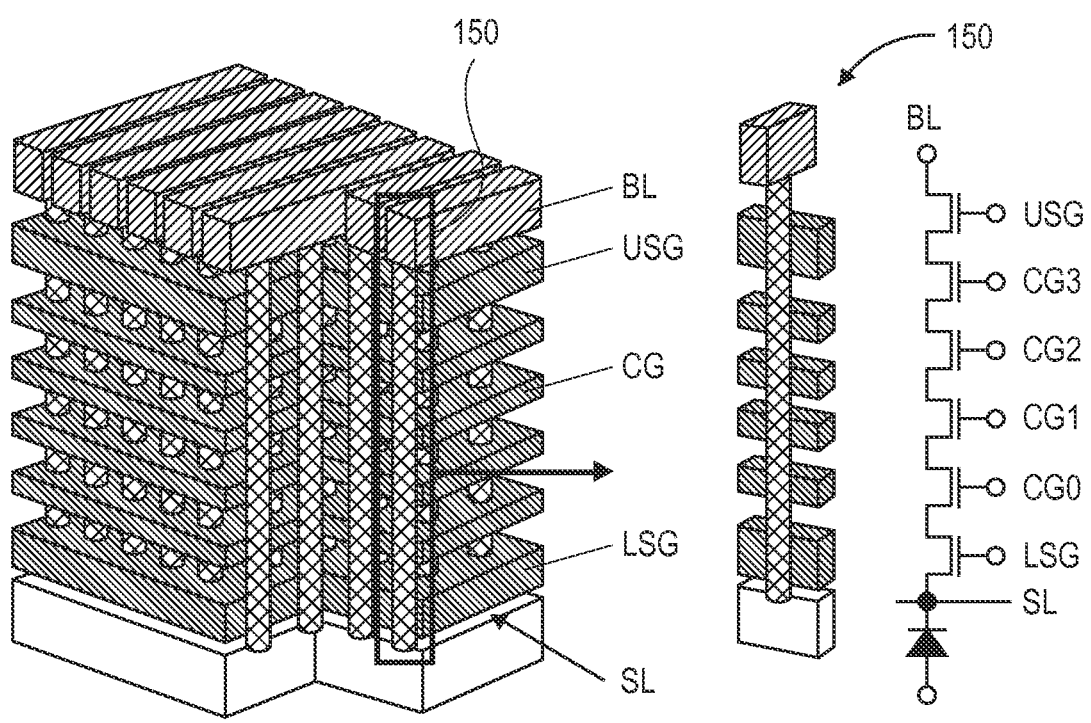
FIG. 1B is an isometric view of a 3D NAND architecture, which may be fabricated in accordance with embodiments of the present invention.
Figure 2A:
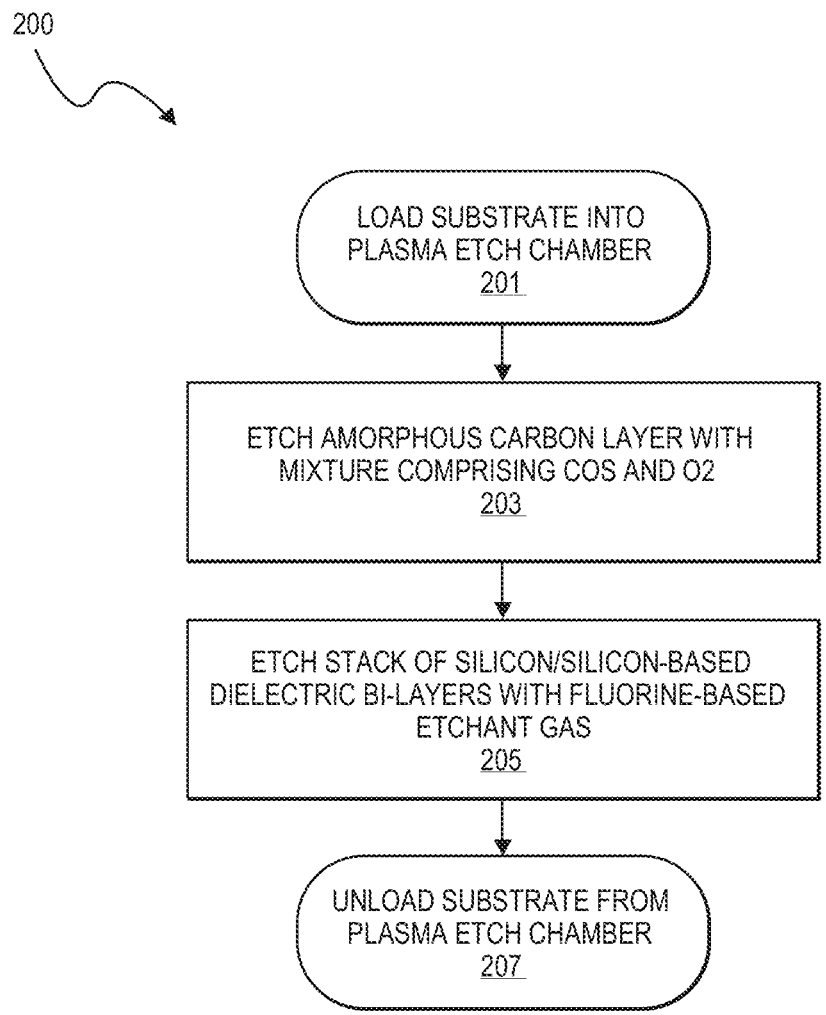
FIG. 2A is a flow diagram depicting a method for opening a mask and etching a stack of polysilicon/silicon dioxide bi-layers, in accordance with an embodiment of the present invention.

FIG. 2A is a flow diagram depicting a method 200 for opening a mask and etching a stack of polysilicon/silicon dioxide bi-layers, in accordance with an embodiment of the present invention. Generally, the method 200 is a single chamber etch process whereby a substrate is first loaded into the chamber at operation 201, and then a non-photo definable mask layer is etched at operation 203 (e.g., during a first portion of a process recipe). After this "mask-open" etch is completed, the same etch chamber performs a second etch process to remove portions of the stack of silicon/silicon-based dielectric bi-layers at operation 205. As previously noted, the plasma etch operation 205 is substantially free of corrosive process gases and instead utilizes fluorine-based source gases. Upon clearing the thickness of the stack, the substrate is unloaded from the etch chamber at operation 207.

Figure 3:
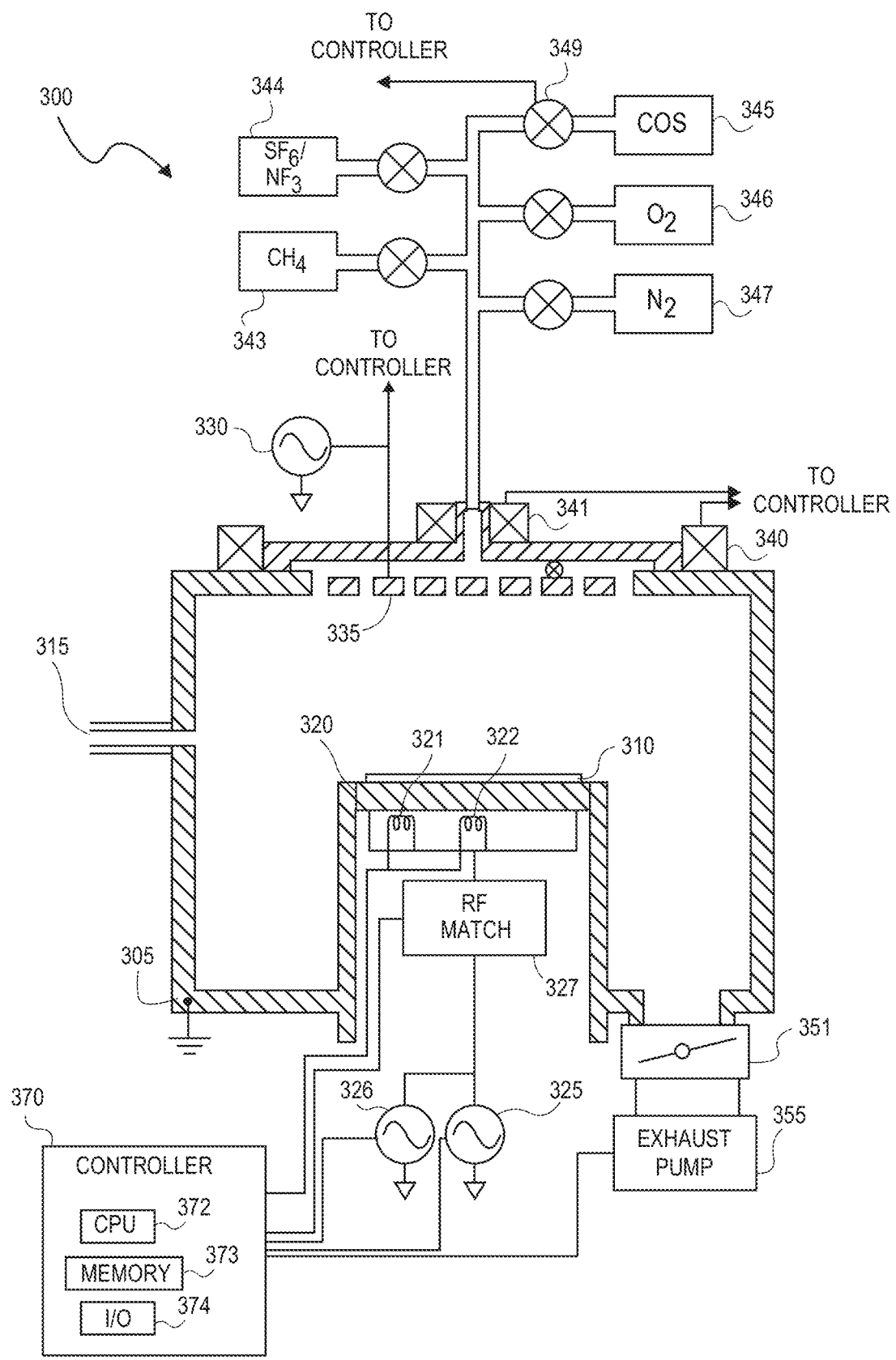
FIG. 3 is a schematic of an etch system, in accordance with an embodiment of the present invention.

FIG. 3 is a schematic of an etch system, which is utilized in performance of the method 200, in accordance with an embodiment of the present invention. The system 300 is in particular embodiments a dielectric etch chamber coupled to a platform, such as the Centura® platform, commercially available from Applied Materials, Inc. of Santa Clara, Calif., and capable of hosting a plurality of systems 300. The system 300 is also commercially available from Applied Materials, Inc. under the trade name of Avatar Etch™. Generally, the system 300 includes a grounded chamber 305. A substrate 310 is loaded into the chamber 300 through an opening 315 and clamped to a temperature controlled cathode 320. In particular embodiments, the temperature controlled cathode 320 include a plurality of zones, each zone independently controllable to a temperature setpoint, such as with a first thermal zone 322 proximate a center of the substrate 310 and a second thermal zone 321 proximate to a periphery of the substrate 310. Process gases are supplied from gas sources 343, 344, 345, 346, and 347 through respective mass flow controllers 349 to the interior of the chamber 305. The chamber 305 is evacuated to between 20 mTorr and 100 mTorr, for example, via an exhaust valve 351 connected to a high capacity vacuum pump stack 355 including a turbo molecular pump.

When RF power is applied, a plasma is formed in chamber processing region over substrate 310. A bias power RF generator 325 is coupled to cathode 320 and provides bias power to energize the plasma. The bias power RF generator 325 typically has a low frequency between about 2 MHz to 60 MHz, and in a particular embodiment, is approximately 2 MHz. In certain embodiments, the plasma etch system 300 includes a second bias power RF generator 326 operable at a frequency of about 60 MHz. The two bias powers are connected to the same RF match 327, however separate matches may also be utilized. Source power RF generator 330 is also coupled through a match (not depicted) to a plasma generating element 335 which may be anodic relative to cathode 320 to provide high frequency source power to energize the plasma. Source RF generator 330 typically has a higher frequency than the bias RF generators 325, 326, and is for example between 100 and 180 MHz, and in one embodiment is in the 162 MHz band. Generally, bias power affects the bias voltage on the substrate 310, controlling ion bombardment of the substrate 310, while source power affects the plasma density relatively independently of the bias on the substrate 310.

It is noted that the etch performance of a given set of input gases from which the plasma is generated varies significantly with a plasma density and wafer bias, thus both the amount and frequency of power energizing the plasma are important, according to embodiments. Because substrate diameters have progressed over time, from 150 mm, 200 mm, 300 mm, etc., it is common in the art to normalize the source and bias power of a plasma etch system to the substrate area. In the illustrated embodiment, the system 300 also includes magnetic coils 340 and 341 to generate a magnetic field which enables tuning of plasma uniformity.

In an embodiment of the present invention, system 300 is computer-controlled by controller 370 to control the low frequency bias power, high frequency source power, source gas flow rates, pressure, and substrate temperature, as well as other process parameters. Controller 370 may be one of any form of general-purpose data processing system that can be used in an industrial setting for controlling the various sub-processors and subcontrollers. Generally, controller 370 includes a central processing unit (CPU) 372 in communication with memory 373 and input/output (I/O) circuitry 374, among other common components. Software commands executed by CPU 372, cause system 300 to, for example, load the substrate into a plasma etch chamber, introduce a process gas mixture including one or more of the process gases from sources 343, 344, 345, 346, and 347, and energize them into a plasma through delivery of RF energy from one or more of the RF sources 325, 326, and 330. Portions of the present invention may be provided as a computer program product, which may include a computer-readable medium having stored thereon instructions, which may be used to program a computer (or other electronic devices) to control the etch system 300 to perform the etch method 200 of FIG. 2A, and/or the etch method 250 of FIG. 2B. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other commonly known type computer-readable storage medium suitable for storing electronic instructions. Moreover, the present invention may also be downloaded as a program file containing a computer program product, wherein the program file may be transferred from a remote computer to a requesting computer.

In embodiments, each of the three RF sources are further configured to operate in either as continuous wave (CW) mode or a pulsed mode where a controller, such as the controller 370, causes one or more of the RF sources to cycle through RF "on" and RF "off" states. In embodiments, as further described herein, all three RF sources 325, 326, and 330 are operated in pulsed mode during at least a portion of the etching of the silicon/silicon-based dielectric stack (e.g., at operation 205).

Figure 2B:
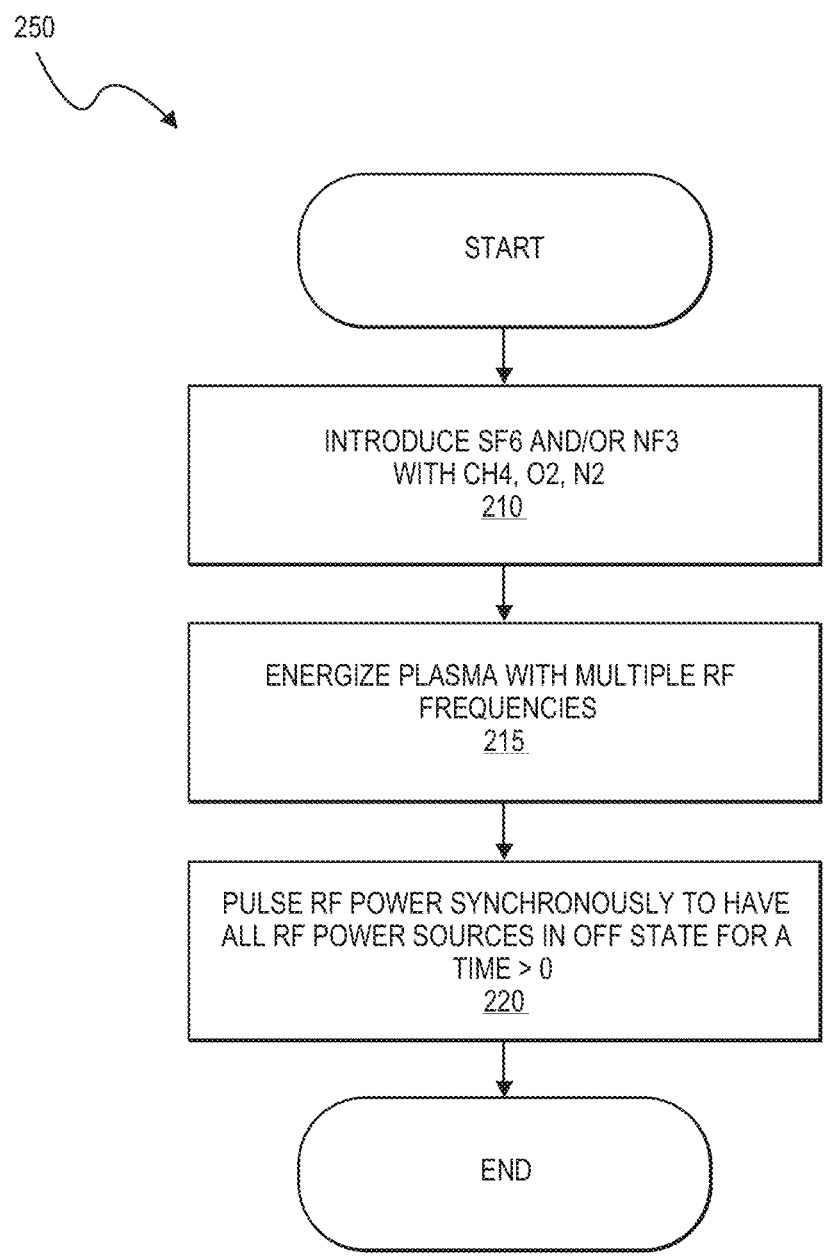
FIG. 2B is a flow diagram depicting a method for etching a stack of polysilicon/silicon dioxide bi-layers, in accordance with an embodiment of the present invention.

FIG. 2B is a flow diagram depicting the method 250 for etching a stack of polysilicon/silicon dioxide bi-layers, in accordance with one such embodiment of the present invention. The method 250 begins with the substrate disposed in the etch chamber, for example following completion of operation 201 in FIG. 2A. The method 250 proceeds with introduction of a fluorine-containing etchant gas, such as $SF_6$ and/or $NF_3$ at operation 210. In the exemplary embodiment, the one or more fluorine-containing etchant gases are mixed with other process gases, including an oxidizer, which is advantageously $O_2$, and a carbon source, which is advantageously $CH_4$. In further embodiments, nitrogen is also introduced, advantageously as $N_2$. Although not bound by theory, it is currently thought that the carbon source serves as a passivation gas as its presence has been found to improve selectivity to mask materials and improve sidewall profiles, while $O_2$ has been found to reduce the occurrence of clogging at the uppermost portion of the etched feature (e.g., via), and also passivate silicon layer side wall portions. Nitrogen may be useful as a tuning gas affecting both profile control and mask erosion rate (i.e., mask selectivity). In one embodiment employing $SF_6$ as the etchant gas, a process gas mixture includes one part $SF_6$, 1.2-1.65, parts $CH_4$, 0.04-0.15 part $O_2$, and 0.7-1.5 parts $N_2$. In certain advantageous embodiments employing $SF_6$ as the etchant gas, a process gas mixture includes one part $SF_6$, 2-30 parts $CH_4$, 0.4-4 parts $O_2$, 1-30 parts $N_2$ and 1-20 parts $NF_3$. Chamber pressure may vary, but the range of 20 to 50 mT has been found advantageous, providing both good etch film etch rates and profile control.

At operation 215, the process gas(es) is energized into a plasma with RF power applied by one or more RF sources. It has been found high aspect ratio (HAR) etching with good selectivity (i.e., of significantly more than 1:1) is achieved when all three RF sources 325, 326, and 330 are utilized to energize the plasma. In the exemplary embodiments, bias power generator 325 delivers a power between 4 and 8 kW, bias power generator 326 delivers a power between 0.5 and 3 kW, and the source generator 330 delivers a power of between 1 and 3 kW.

Figure 5:
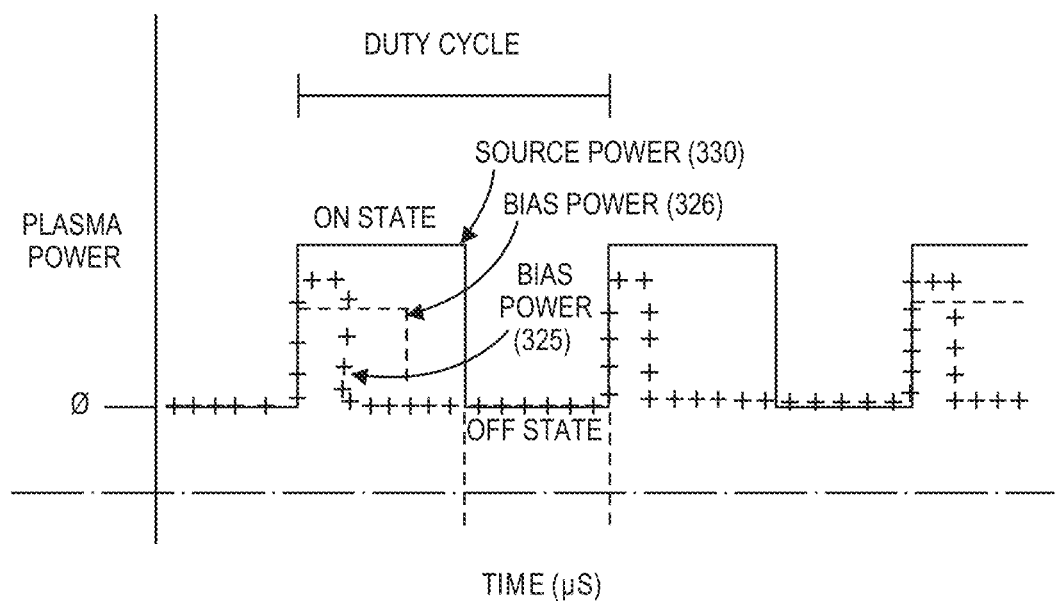
FIG. 5 is a timing diagram depicting RF pulsing in accordance with embodiments of the present invention.

At operation 220, the RF energy is pulsed over time between the RF on state and an RF off state. It has been found that a much higher selectivity to mask materials, particularly amorphous carbon mask layers, is achieved when the RF energy is pulsed over time between the RF on state and an RF off state. In advantageous embodiments, pulsing increases selectivity over amorphous carbon mask materials to 2:1, or more. Also, pulsing has been found to reduce the occurrence of etch stop on the (poly) silicon layer as aspect ratio increases. FIG. 5 is a timing diagram depicting RF pulsing in accordance with embodiments of the present invention. As shown, plasma power is cycled over a duty cycle. Generally, either a single RF energy source may be pulsed or a plurality of RF sources may be pulsed synchronously during the pulsed plasma etch operation 220. In single RF source pulsing, either the source power 330 or one of the bias powers 325, 326 may be pulsed with the remaining RF sources either operated at a duty cycle of 0% (continuously off) or 100% (continuous wave).

Synchronous pulsing embodiments have been found by the inventors to be particularly advantageous for maintaining both high mask selectivity (e.g., of 2:1, or more, for the exemplary $SF_6$, $NF_3$, $CH_4$, $O_2$, $N_2$ process gas mixtures described elsewhere herein), and reducing etch stop as the aspect ratio increases beyond 20, and more particularly beyond 25-30. In synchronous pulsing, two or more RF sources are pulsed with duty cycles being equal and in-phase, or unequal and/or out of phase with each other. In a highly advantageous embodiment, all RF frequencies are in the RF off state concurrently for at least some period of time during a duty cycle of the pulse (i.e., duty cycles, even if unequal are in phase). As shown in FIG. 5, even where the duty cycles are unequal, for example with the duty cycle of the source power 330 being greater than that of the bias power 326, which is in turn greater than that of the bias power 325, there is a period of time, where all three generators are in the RF off state concurrently. The plasma pulse frequency for each RF generator may generally between 1 Hz and 200 kHz, but pulsing in the range of 5-8 kHz with off cycles overlapping for between 20 and 125 μsec (micro-second) have been found advantageous for etching silicon/silicon dioxide multilayers.

Figure 6A:
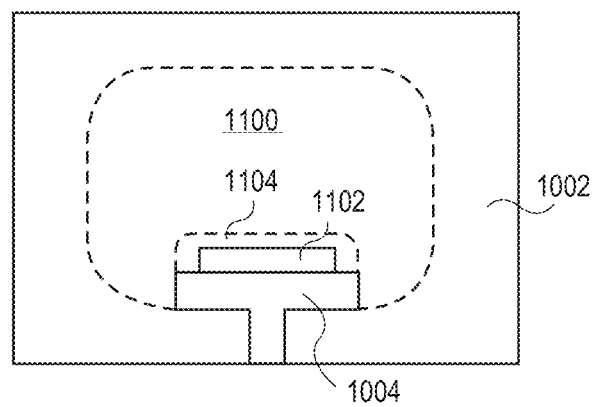
FIGS. 6A and 6B illustrate a plasma etch chamber with RF power in on and off states, in accordance with embodiments of the present invention.
Figure 6B:
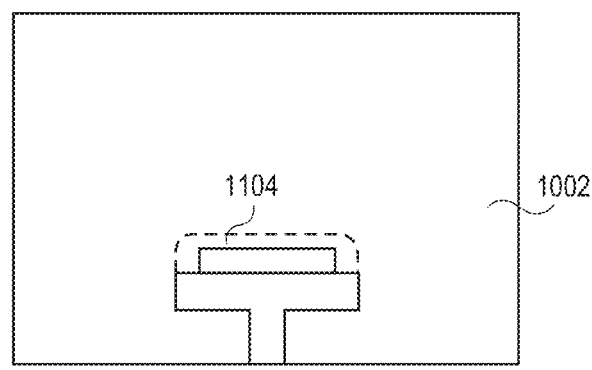

FIGS. 6A-6B illustrate a chamber, for example from the etch system 300, in a plasma ON state and a plasma OFF state, respectively, in accordance with an embodiment of the present invention. Referring to FIG. 6A, a reaction region 1104 is formed in proximity to a workpiece 1102 disposed on the chuck 1004 during an ON state when the plasma 1100 is present. During the pulsed etch operation 220, etch by-products may be formed and reside, at least for a time, within the reaction region 1104. Thus, in accordance with an embodiment of the present invention, the set of instructions for the pulse controller 370 includes timing instructions such that the ON state is of a sufficiently short duration to substantially impart ion energies at a first nominal level (e.g., 20 eV) within the reaction region 1104. Referring to FIG. 4B, the chamber 1002 is in a plasma OFF state (e.g., a neutral reaction gas). In accordance with an embodiment of the present invention, the set of instructions for the pulse controller 370 includes timing instructions such that the OFF state of a duty cycle in the pulsed plasma etch operation 220 is selected to be of a sufficiently long duration to clear the etching front of reaction products and refresh the exposed surfaces at the etching front with process gas species. This time is currently believed to be on the order of 10 s or 100 s of micro-seconds.

Even during RF pulsing, process gas may keep continually flowing. However, because reaction gas species used to generate the plasma may be consumed during the ON state of a duty cycle in a pulsed plasma etch process, plasma self-bias conditions may change over the duration of a plasma pulsing duty cycle. In some instances, the plasma modification may be substantial enough to alter the plasma bias potential. By replenishing the reaction gas during the etching process, plasma modification may be mitigated.

Figure 4A:
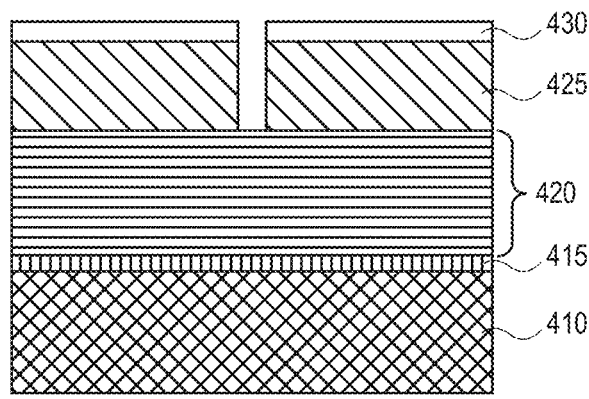
FIGS. 4A-4C are cross-sectional views of structures formed as operations in the methods of FIGS. 2A and 2B are performed, in accordance with embodiments.
Figure 4B:
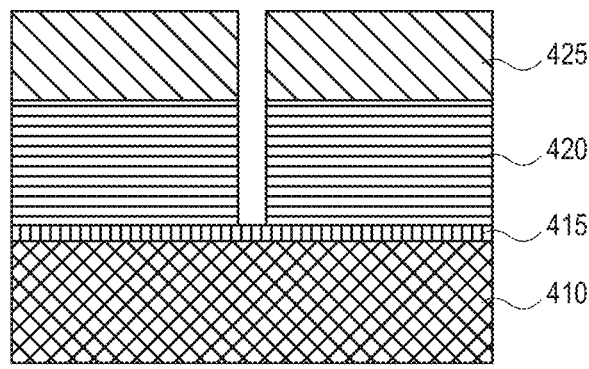
Figure 4C:
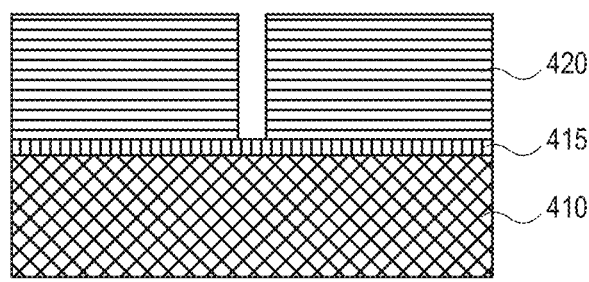

In embodiments, FIGS. 4A-4C are cross-sectional views of structures formed as operations in the methods of FIGS. 2A and 2B are performed, in accordance with embodiments, to form a three dimensional (3D) NAND memory device. Referring first to FIG. 4A, a mask open etch is performed to open a pattern in a non-photo definable material, such as, but not limited to a carbonaceous layer. As used herein, a carbonaceous layer includes inorganic layers with at least 20 wt % carbon. Included in this class of materials is amorphous carbon, typically having greater than 50 wt % carbon, and low-k dielectrics having at least 20 wt % carbon content. Excluded from the "carbonaceous" class are organic materials having a total carbon content less than 20 wt %, such as those commonly employed as bottom anti-reflective coating (BARC) layers, which typically include polyamides and polysulfones and have less than 5 wt % carbon. In the illustrated embodiment, the carbonaceous layer 425 is formed over a stack 420 of bi-layers, an etch stop layer 415, and a substrate 410.

The carbonaceous layer 425 may be formed with spray on/spin on methods, with a thermal deposition process (CVD), or a plasma enhanced deposition process (PECVD). In the embodiment depicted in FIG. 4A, amorphous carbon layer 425 is deposited with either CVD or PECVD to form a carbon material comprising at least 50 wt % carbon with sp1, sp2, and sp3 bonding states giving the film properties which are a hybrid of those typical of pyrolytic, graphitic, and diamond-like carbon. Because the deposited carbon material may contain a plurality of bonding states in various proportions, it lacks long range order and so is commonly referred to as "amorphous carbon." In particular embodiments, the amorphous carbon layer 425 may be formed with a PECVD process using hydrocarbon precursors, such as, but not limited to, methane ($CH_4$), propylene ($C_3H_6$), propyne ($C_3H_4$), propane ($C_3H_8$), butane ($C_4H_{10}$), butylenes ($C_4H_8$), butadiene ($C_4H_6$), acetylene ($C_2H_2$), toluene ($C_7H_8$ ($C_6H_5CH_3$)) and mixtures thereof. The amorphous carbon layer 425 may also include nitrogen or other additives, such as boron dopants. An exemplary amorphous carbon material is commercially available from Applied Materials, Inc., CA, U.S.A. under the trade name Advanced Patterning Film™ (APF), while a boron-doped amorphous carbon material is also available from Applied Materials under the trade name Saphira. Though not depicted, in another embodiment at the lower end of the carbon wt % range, the carbonaceous layer is a low-k dielectric, such as that commercially available from Applied Materials, Inc., under the trade name of Black Diamond™.

In the exemplary embodiment, the carbonaceous mask 425 has a thickness of at least 1.2 µm, and may be 3-5 µm, or more, depending on the thickness of the underlying stack 420 of bi-layers. As also depicted in FIG. 4A, the amorphous carbon layer 425 is capped with an inorganic dielectric cap layer 430. The inorganic dielectric cap layer 430 may serve as a dielectric anti-reflective layer (DARC) and/or improve adhesion of subsequent organic films applied by spin-on techniques, which may otherwise not adhere well to the amorphous carbon layer 425. The inorganic dielectric cap layer 430 may be a single film or a multi-layered stack of films including silicon, nitride, oxygen in the form of silicon dioxide, silicon nitride or silicon oxy-nitride (SiON). The composition and thickness may also be tuned to provide minimal reflections and high contrast for a particular wavelength employed during photolithographic patterning of features. In exemplary embodiments, the inorganic dielectric cap layer 430 is formed to a thickness of between about 25 nm and 400 nm. Disposed over the cap layer 430 is any conventional photoresist (not depicted), utilized as a mask for the etch used to open the cap layer 430 and/or the mask open etch during which the carbonaceous layer 425 is opened. In some photoresist embodiments, an organic BARC is applied on the inorganic dielectric cap layer 430 to further reduce reflection of light during patterning of the photosensitive layer. The BARC typically includes polyamides and polysulfones.

In particular embodiments, mask-open etch (e.g., performed at operation 203 in FIG. 2A) is performed with a process gas mixture including a carbon sulfur terminal ligand having the general chemical formula of $(COS)_x$. In a preferred embodiment, the gas including a carbon sulfur terminal ligand is carbonyl sulfide, COS. While two component COS: $O_2$ etchant mixture embodiments may be advantageous, improvement in sidewall profile may be attained with the introduction of other species to the process gas mixture. In particular embodiments, the etchant gas mixture further includes at least one of $N_2$, CO, $CO_2$, $O_3$, $H_2O$, $H_2O_2$. It is also noted that in alternate embodiments, the $N_2$ source may be replaced with other nitrogen sources, such as, but not limited to nitrogen oxides (NO, $N_2O$, etc.) or ammonia ($NH_3$). The etchant gas mixture may further include an inert gas, such as Ar, He, or Xe.

Following the mask open plasma etch, the process gas chemistry is adjusted (e.g., during a second, "main etch" recipe step) to include $SF_6$ and/or $NF_3$, along with the oxygen-containing (e.g., $O_2$), carbon-containing (e.g., $CH_4$), and nitrogen containing (e.g., $N_2$) source gases (e.g., at the ratios described elsewhere herein). A plasma is then energized (e.g., with the bias and source powers described elsewhere herein), and pulsed in the exemplary embodiment, as described elsewhere herein. This main etch (e.g., operation 205 in FIG. 2A) is performed for a timed duration, or until a stop layer (e.g., 415 in FIG. 4B) is exposed, to clear an opening (e.g., a via) through the stack 420 including 16-24, silicon word line gate electrode layers (e.g., polysilicon) electrically isolated from each other by an intervening silicon-based dielectric layer (e.g., silicon dioxide). In embodiments, for each bi-layer, the (poly)silicon layer has a thickness at least as great as that of the silicon dioxide. As one example, each (poly)silicon word line gate electrode layer has a thickness of 50-60 nm while each silicon dioxide layer has a thickness of 20-50 nm. In embodiments, the thickness of the stack 420 has a total thickness between 1.5 μm and 3 μm with the openings (e.g., vias for memory line plugs or trenches for bifurcating the word line electrodes) etched into the stack 420 being 60-80 μm in diameter. As such, the aspect ratios of the features etched are 25-40, or more. In the exemplary embodiments employing the fluorine-based chemistries described herein with RF pulsing as described herein, etching of the stack 420 proceeds at a rate that is greater than the etch rate of the carbonaceous mask 425 (e.g., greater than 1:1 selectivity), and advantageously at least 2:1. As shown in FIG. 4C, with the mask 425 removed, the patterned stack 420 is ready for further processing in conformance with techniques known in the art. In one embodiment, for example, a plug is formed in each etched opening to form a vertical NAND memory string.

Figure 8A:
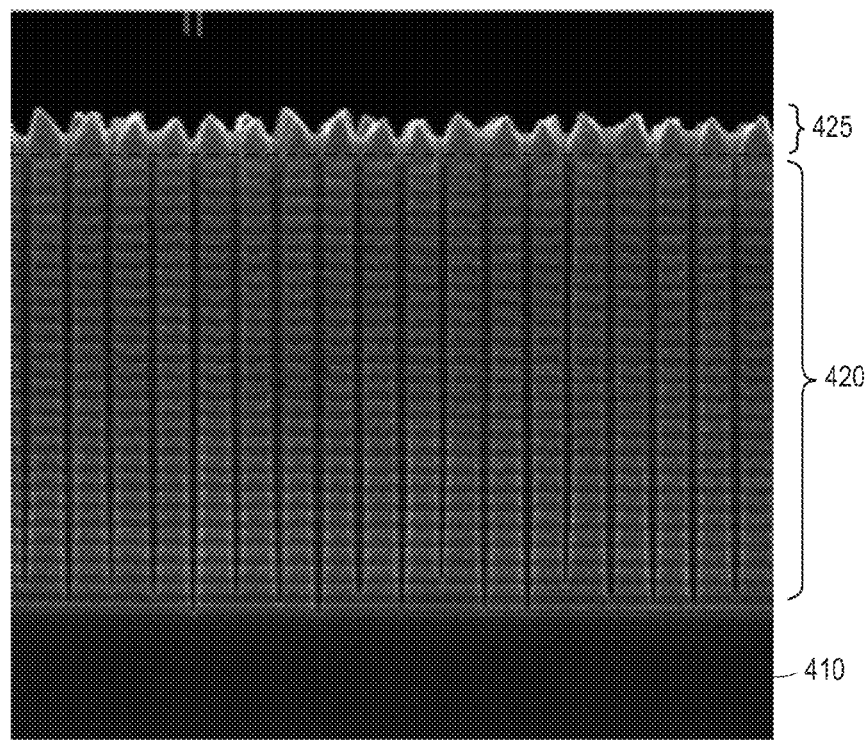
FIG. 8A is a cross-sectional SEM image of a stack of polysilicon/silicon dioxide bi-layers etched by with non-corrosive process gases, in accordance with embodiments of the present invention.
Figure 8B:
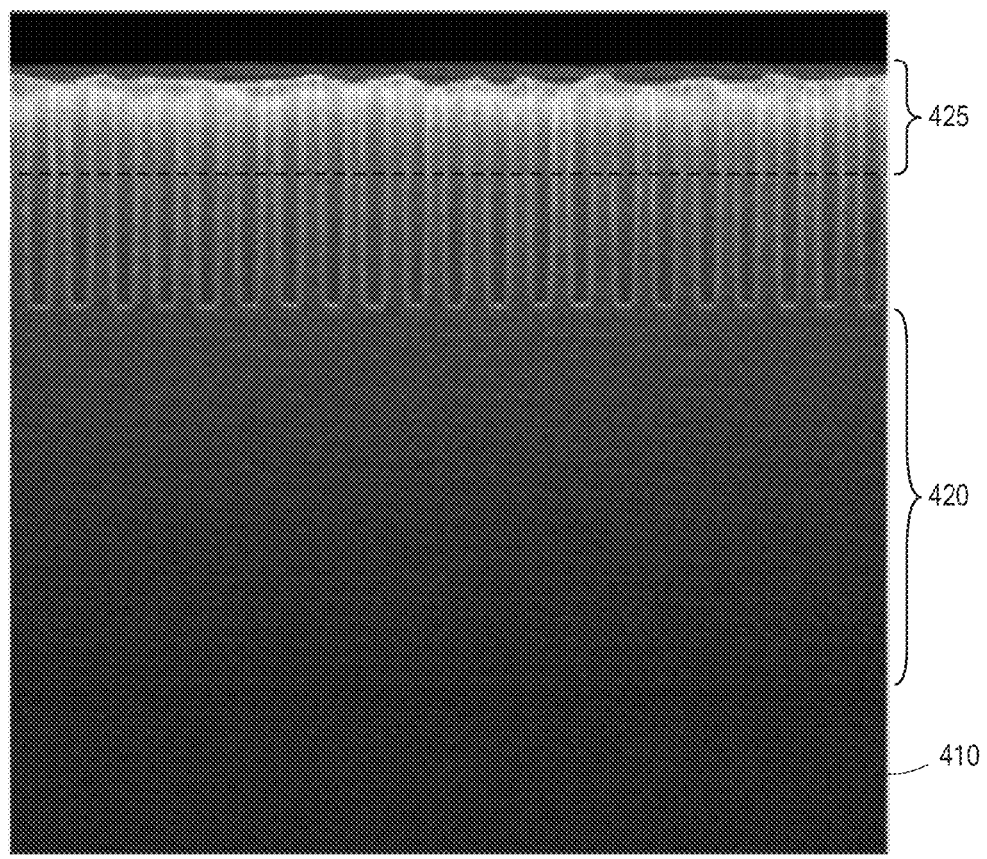
FIG. 8B is a cross-sectional SEM image of a stack of polysilicon/silicon dioxide bi-layers etched by a conventional dielectric etch process.

FIGS. 7A and 7B are tables depicting plasma etch conditions in accordance with embodiments of the present invention. FIG. 8A is a cross-sectional SEM of a stack of polysilicon/silicon dioxide bi-layers etched by with the non-corrosive etchant gases listed in FIG. 7A, in accordance with embodiments of the present invention. As shown in FIG. 8A, and as compared to FIG. 8B, the stack 420 is nearly completely etched through without breaking through the mask 425. The difficulty of etching a bi-layer stack of polysilicon and silicon dioxide with a dielectric etch tool is demonstrated in FIG. 8B, which is a cross-sectional SEM image showing a test wafer including the same stack of bi-layers 420 disposed over a substrate 410 as that depicted in FIG. 8A. However, the etch process employed in FIG. 8B is a more conventional dielectric etch process, also employing fluorine-based chemistry, but lacking RF pulsing and the specific process gas mixtures characterized by the table in FIG. 7A. As such, FIG. 8B represents a result that is achievable with a conventional dielectric etch system running a conventional via etch process. Notably, in contrast to FIG. 8A, the stack of bi-layers 420 is etched only partially (~20% of stack thickness), and yet, as highlighted by the dotted line, the masking material 425 has been extensively consumed (i.e., etch selectivity is much less than 2:1, and may even be less than 1:1 for certain chemistries and power combinations).

The table in FIG. 7B illustrates other embodiments involving RF pulsing and gas ratios similar to those in the table of FIG. 7A. However, the gas mixtures described in the table of FIG. 7B include $NF_3$ in addition to $SF_6$. Gas mixtures including $NF_3$ and $SF_6$ may result in similar, or improved, etching results in comparison to the gas ratios described in FIG. 7A.

Returning to FIG. 4C, following the main etch, any remaining mask material may be stripped, for example, in-situ (within the same etch chamber that performed the mask-open and main etch operations) to arrive at the patterned structure depicted in FIG. 4A. Following the completion of the plasma etch, the substrate is unloaded from the etch chamber and the 3D NAND processing proceeds in any manner known in the art (e.g., memory plug deposition, etc.).

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of etching a stack of silicon and dielectric layers disposed over a substrate, the method comprising:
    loading the substrate into a plasma etch chamber, the substrate having a mask layer disposed over the stack of silicon and dielectric layers;
    introducing process gases into the chamber, wherein the process gases comprise one part $SF_6$, 2-30 parts $CH_4$, 0.4-4 parts $O_2$, 1-30 parts $N_2$ and 1-20 parts $NF_3$ at a chamber pressure between 20 and 50 mT;
    energizing the process gases into a plasma with RF energy of at least one frequency, wherein the RF energy is pulsed over time between an RF on state and an RF off state; and
    etching, with the plasma, portions of the stack not covered by the mask layer, the etching having a selectivity to the mask layer of at least 1:1.

2. The method of claim 1, wherein the stack comprises at least 16 bi-layers, each bi-layer having a layer of polysilicon and a layer of silicon dioxide, and wherein the mask layer comprises amorphous carbon.

3. The method of claim 1, wherein the process gases include a fluorine-containing gas and is substantially free of HBr and $Cl_2$.

4. The method of claim 1, wherein the RF energy comprises a plurality of frequencies pulsed synchronously with all RF frequencies in the RF off state concurrently for at least some period of time during a duty cycle of the pulse.

5. The method of claim 4, wherein the RF energy is supplied by a first generator operating at 2 MHz, a second generator operating at 60 MHz, and a third generator operating at 162 MHz, and wherein each generator is pulsed with a corresponding duty cycle, the three duty cycles synchronized to having all three generators in the RF off state concurrently for the at least some period of time.

6. The method of claim 5, wherein the period of time is between 20 and 125 μs.

7. The method of claim 5, wherein the first and second generators deliver a power between 4 and 8 kW, and wherein the third generator delivers a power of between 1 and 3 kW.

8. The method of claim 1, further comprising:
    etching through the mask layer selectively to an overlying patterned layer with a second plasma subsequent to loading the substrate into the chamber, the second plasma comprising species energized from second process gases including COS, $N_2$, and $O_2$.

9. A method of forming a three dimensional (3D) NAND memory device, the method comprising:
    loading a substrate into a plasma etch chamber, the substrate having a mask layer disposed over a stack of silicon word line gate electrode layers electrically isolated from each other by an intervening silicon-based dielectric layer;
    introducing process gases into the chamber, wherein the process gases comprise one part $SF_6$, 2-30 parts $CH_4$, 0.4-4 parts $O_2$, 1-30 parts $N_2$ and 1-20 parts $NF_3$, at a chamber pressure between 20 and 50 mT;

energizing the process gases into a plasma with RF energy of at least one frequency, wherein the RF energy is pulsed over time between an RF on state and an RF off state; and etching, with the plasma, vias or trenches through the thickness of the stack in regions not covered by the mask layer, the etching having a selectivity to the mask layer greater than 1:1.

10. The method of claim 9, wherein the stack comprises at least 16 bi-layers, each bi-layer having a layer of polysilicon and a layer of silicon dioxide, and wherein the mask layer comprises amorphous carbon.

11. The method of claim 9, wherein the RF energy is supplied by a first generator operating at 2 MHz, a second generator operating at 60 MHz, and a third generator operating at 162 MHz, and wherein each generator is pulsed with a corresponding duty cycle, the three duty cycles synchronized to having all three generators in the RF off state concurrently for at least some period of time.

12. The method of claim 11, wherein the period of time is between 20 and 100 msec.

\* \* \* \* \*